(12) United States Patent
Campbell et al.

(10) Patent No.: US 7,641,101 B2
(45) Date of Patent: Jan. 5, 2010

(54) METHOD OF ASSEMBLING A COOLING SYSTEM FOR A MULTI-COMPONENT ELECTRONICS SYSTEM

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 450 days.

(21) Appl. No.: 11/539,907

(22) Filed: Oct. 10, 2006

(65) Prior Publication Data

US 2008/0092387 A1    Apr. 24, 2008

(51) Int. Cl.
*H05K 7/20* (2006.01)
*F28F 7/00* (2006.01)

(52) U.S. Cl. .................. 228/183; 361/699; 165/80.4
(58) Field of Classification Search ............ 228/183, 228/101; 29/890.03, 428, 464; 361/699, 361/702, 711; 165/80.4; 62/259.2
See application file for complete search history.

(56) References Cited

U.S. PATENT DOCUMENTS

| | | | | |
|---|---|---|---|---|
| 5,428,897 A | * | 7/1995 | Jordan et al. | 29/890.03 |
| 6,108,899 A | * | 8/2000 | Piccirilli | 29/726 |
| 6,748,656 B2 | * | 6/2004 | Woerner et al. | 29/890.03 |
| 7,011,143 B2 | | 3/2006 | Corrado et al. | 165/80.4 |
| 2004/0221604 A1 | * | 11/2004 | Ota et al. | 62/259.2 |
| 2006/0002086 A1 | * | 1/2006 | Teneketges et al. | 361/699 |

OTHER PUBLICATIONS

Colbert et al., "Method and Apparatus for Mounting a Heat Sink in Thermal Contact with an Electronic Component", U.S. Appl. No. 11/201,972, filed Aug. 11, 2005.
Colbert et al., "Heatsink Apparatus for Applying a Specified Compressive Force to an Integrated Circuit Device", U.S. Appl. No. 11/460,334, filed Jul. 27, 2006.

* cited by examiner

*Primary Examiner*—Kevin P Kerns
*Assistant Examiner*—Kevin E Yoon
(74) *Attorney, Agent, or Firm*—Geraldine Monteleone, Esq.; Kevin P. Radigan, Esq.; Heslin Rothenberg Farley & Mesiti P.C.

(57) ABSTRACT

A cooling system assembly method including: providing a support fixture having a multi-level support surface and multiple positioning dowels extending therefrom; positioning multiple liquid-cooled cold plates on the support surface employing the multiple dowels, the dowels providing relative positioning and alignment of the cold plates for facilitating subsequent coupling thereof to electronic components to be cooled; sealing multiple coolant-carrying tubes in fluid communication with the cold plates; and sealing a header subassembly to the coolant-carrying tubes to provide an assembled liquid-based cooling system. In operation, the support fixture facilitates shipping of the assembled cooling system by maintaining the components in fixed relation. A transfer fixture is employed in removing the cooling system from the support fixture and placing the cooling system in engagement with the electronics system. The transfer fixture includes multiple clips engaging and holding components of cooling system in fixed relation when removed from the support fixture.

20 Claims, 12 Drawing Sheets

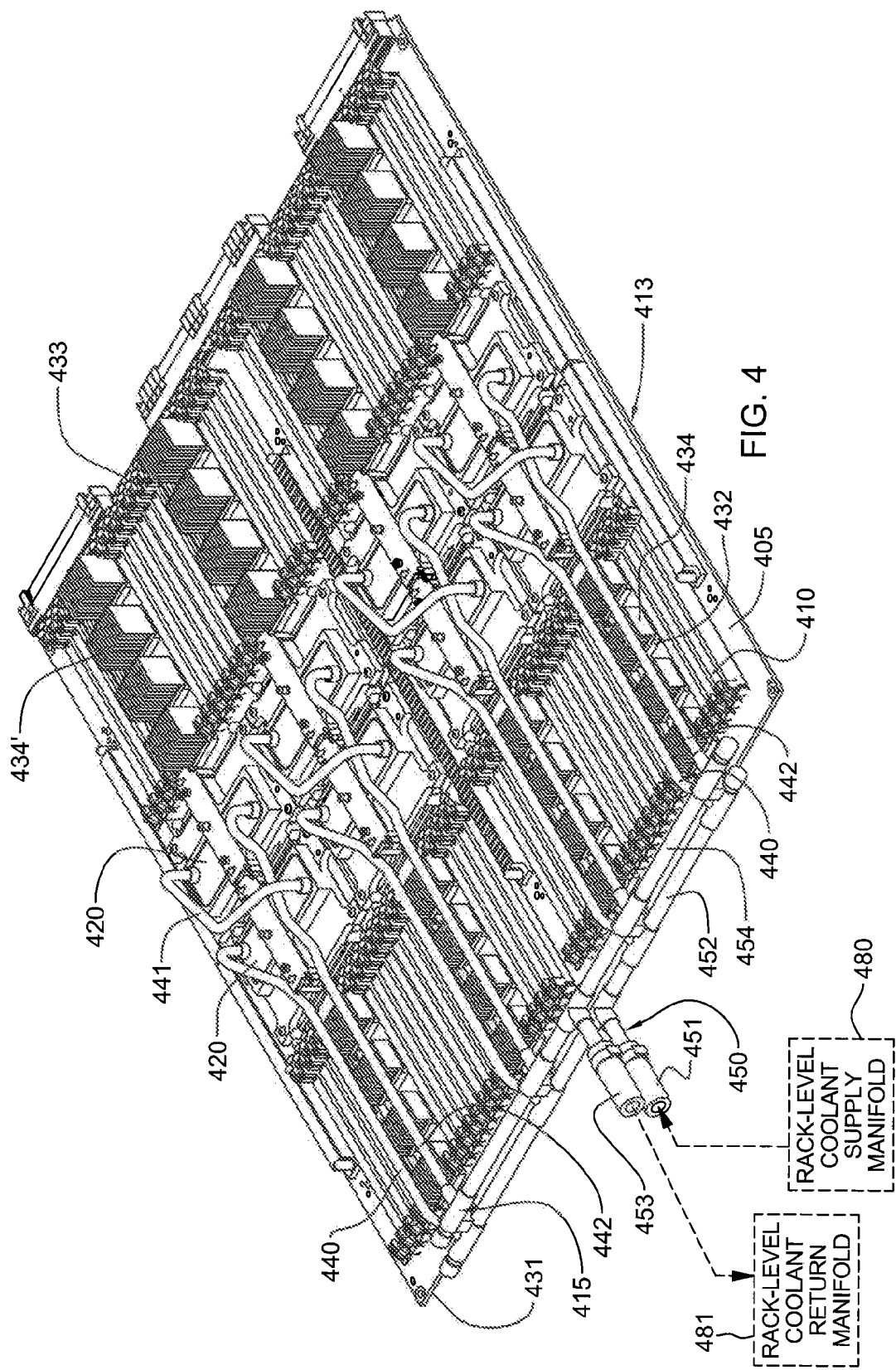

METHOD OF ASSEMBLING A COOLING SYSTEM FOR A MULTI-COMPONENT ELECTRONICS SYSTEM

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Hybrid Cooling System and Method for a Multi-Component Electronics System", Campbell et al., U.S. Ser. No. 11/539,902, filed Oct. 10, 2006, which issued Jul. 15, 2008 as U.S. Pat. No. 7,400,505 B2;

"Cooling System and Method for a Multi-Component Electronics System Employing Conductive Heat Transport", Campbell et al., U.S. Ser. No. 11/539,905, filed Oct. 10, 2006, which issued Aug. 5, 2008 as U.S. Pat. No. 7,408,776 B2;

"Liquid-Based Cooling System for Cooling a Multi-Component Electronics System", Campbell et al., U.S. Ser. No. 11/539,910, filed Oct. 10, 2006, which issued Sep. 2, 2008 as U.S. Pat. No. 7,420,808 B2;

"Method and Apparatus for Mounting a Heat Sink in Thermal Contact with an Electronic Component", Colbert et al, Ser. No. 11/201,972, filed Aug. 11, 2005, which issued Feb. 3, 2009 as U.S. Pat. No. 7,486,516; and "Heatsink Apparatus for Applying a Specified Compressive Force to an Integrated Circuit Device", Colbert et al, Ser. No. 11/460,334, filed Jul. 27, 2006, which published on Jan. 31, 2008 as U.S. Pat. No. 2008/0024991 A1.

TECHNICAL FIELD

The present invention relates in general to cooling an electronics system, and more particularly, to cooling system assembly and installation methods for a multi-component electronics system. Still more particularly, the present invention relates to a method of assembling a liquid-based cooling system having multiple liquid-cooled cold plates to be coupled to respective heat generating components of a multi-component electronics system.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of air exhausted into the computer center.

In many large server applications, processors along with their associated electronics (e.g., memory, disk drives, power, etc.), are packaged in removable drawer configurations stacked or aligned within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, for example, through the use of a more powerful air moving device or by increasing the rotational speed (i.e., RPMs) of an existing air moving device. However, this approach is becoming unmanageable at the frame level in the context of a computer installation (e.g., data center).

The sensible heat load carried by the air exiting the frame will eventually exceed the ability of room air conditioning to effectively handle the load. This is especially true for large installations of "server farms" or large banks of computer frames close together. In such installations, not only will the room air conditioning be challenged, but the situation may also result in recirculation problems with some fraction of the "hot" air exiting one frame being drawn into the air inlet of the same or a nearby frame. Furthermore, while the acoustic noise level of a powerful (or higher RPM) air moving device in a single drawer may be within acceptable acoustic limits, because of the number of air moving devices in the frame, the total acoustic noise at the frame level may not be acceptable. In addition, the conventional openings in the frame for the entry and exit of air flow make it difficult, if not impossible to provide effective acoustic treatment to reduce the acoustic noise level outside the frame. Finally, as operating frequencies continue to increase, electromagnetic cross talk between tightly spaced computer frames is becoming a problem largely due to the presence of the openings in the covers.

Accordingly, there is a significant need for enhanced cooling mechanisms for electronic components, individually and at all levels of packaging, including for example, rack-mounted or blade-mounted electronic components of various large computer systems today.

SUMMARY OF THE INVENTION

The need to cool current and future high heat load, high heat flux electronic components requires development of aggressive thermal management techniques, such as liquid-based cooling systems and methods of fabrication. The concepts disclosed herein address the need for enhanced liquid-based cooling system assembly and installation methods for facilitating cooling of a multi-component electronics system.

Briefly summarized, the present invention comprises in one aspect a method of assembling a cooling system for an electronics system. The cooling system assembly method includes: providing a support fixture for facilitating assembly of a liquid-based cooling system for an electronics system having multiple heat generating components to be cooled, the support fixture including a multi-level support surface and multiple positioning dowels extending from a portion thereof; positioning multiple liquid-cooled cold plates on the support surface of the support fixture employing the multiple positioning dowels extending therefrom, the multiple positioning dowels providing relative positioning and alignment of the multiple liquid-cooled cold plates for facilitating subsequent coupling thereof to the multiple heat generating components to be cooled; sealing multiple coolant-carrying tubes in fluid communication with the multiple liquid-cooled cold plates, the multiple coolant-carrying tubes facilitating passage of liquid coolant through the multiple liquid-cooled cold plates when the liquid-based cooling system is operational; and sealing a header subassembly to the multiple coolant-carrying tubes to provide an assembled liquid-based cooling system, the header subassembly comprising a coolant supply header secured in fluid communication with coolant supply tubes of the multiple coolant-carrying tubes and a coolant return header secured in fluid communication with coolant return tubes of the multiple coolant-carrying tubes. When in use, the support fixture further facilitates transport of the assembled liquid-based cooling system by facilitating maintenance of the multiple liquid-cooled cold plates, multiple coolant-carrying tubes and header subassembly in fixed relation.

In another aspect, a method of assembling a cooling system for cooling an electronics system is provided. The cooling system assembly method includes: obtaining an assembled liquid-based cooling system comprising multiple liquid-cooled cold plates connected to multiple coolant-carrying tubes in fluid communication with the multiple liquid-cooled cold plates, and including a header subassembly secured to the multiple coolant-carrying tubes, the header subassembly comprising a coolant supply header secured in fluid communication with coolant supply tubes of the multiple coolant-carrying tubes and a coolant return header secured in fluid communication with coolant return tubes of the multiple coolant-carrying tubes, the assembled liquid-based cooling system residing on and being supported in fixed relation by a support fixture, and being configured to cool multiple heat generating components of an electronics system when operationally coupled thereto; employing a transfer fixture for engaging and removing the assembled liquid-based cooling system from the support fixture, the transfer fixture including a rigid support structure comprising multiple clips for engaging the multiple liquid-cooled cold plates and the header subassembly and for holding the multiple liquid-cooled cold plates and the header subassembly in fixed relation when removed from the support fixture; and employing the transfer fixture to place the assembled liquid-based cooling system in engagement with the electronics system, wherein the electronics system includes multiple dowels positioning the multiple heat generating components to be cooled, the multiple dowels also facilitating placement of the multiple liquid-cooled cold plates of the assembled liquid-based cooling system in proper engagement with respective heat generating components of the electronics system to be cooled employing the transfer fixture.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 4 depicts one embodiment of a partially assembled electronics system wherein eight primary heat generating components to be cooled have coupled thereto respective liquid-cooled cold plates of an assembled liquid-based cooling system, in accordance with an aspect of the present invention;

BEST MODE FOR CARRYING OUT THE INVENTION

As used herein "electronics system" comprises any system containing one or more heat generating components of a computer system or other electronics unit requiring cooling. The terms "electronics rack", "electronics frame", and "frame" are used interchangeably, and include any housing, rack, compartment, blade chassis, etc., having heat generating components of a computer system or electronics system and may be for example, a stand-alone computer processor having high, mid or low end processing capability. In one embodiment, an electronics frame comprises multiple electronics drawers, each having multiple heat generating components disposed therein requiring cooling. "Electronics drawer" refers to any sub-housing, blade, book, drawer, node, compartment, etc., having multiple heat generating electronic components disposed therein. Each electronics drawer of an electronics frame may be movable or fixed relative to the electronics frame, with rack mounted electronics drawers and blades of a blade center system being two examples of drawers of an electronics frame to be cooled.

"Electronic component" refers to any heat generating electronic component of, for example, a computer system or other electronics unit requiring cooling. By way of example, an electronic component may comprise one or more integrated circuit chips and/or other electronic devices to be cooled, including one or more processor modules, memory modules and memory support modules. As used herein, "primary heat generating component" refers to a primary heat generating electronic component within the electronics system (with a processor module being one example), while "secondary heat generating component" refers to an electronic component of the electronics system generating less heat than the primary heat generating component to be cooled (with memory modules and memory support modules being examples of secondary components to be cooled). Further, unless otherwise specified herein, the term "liquid-cooled cold plate" refers to any conventional thermally conductive structure having a plurality of channels or passageways formed therein for flowing of liquid coolant therethrough.

Figure 1:
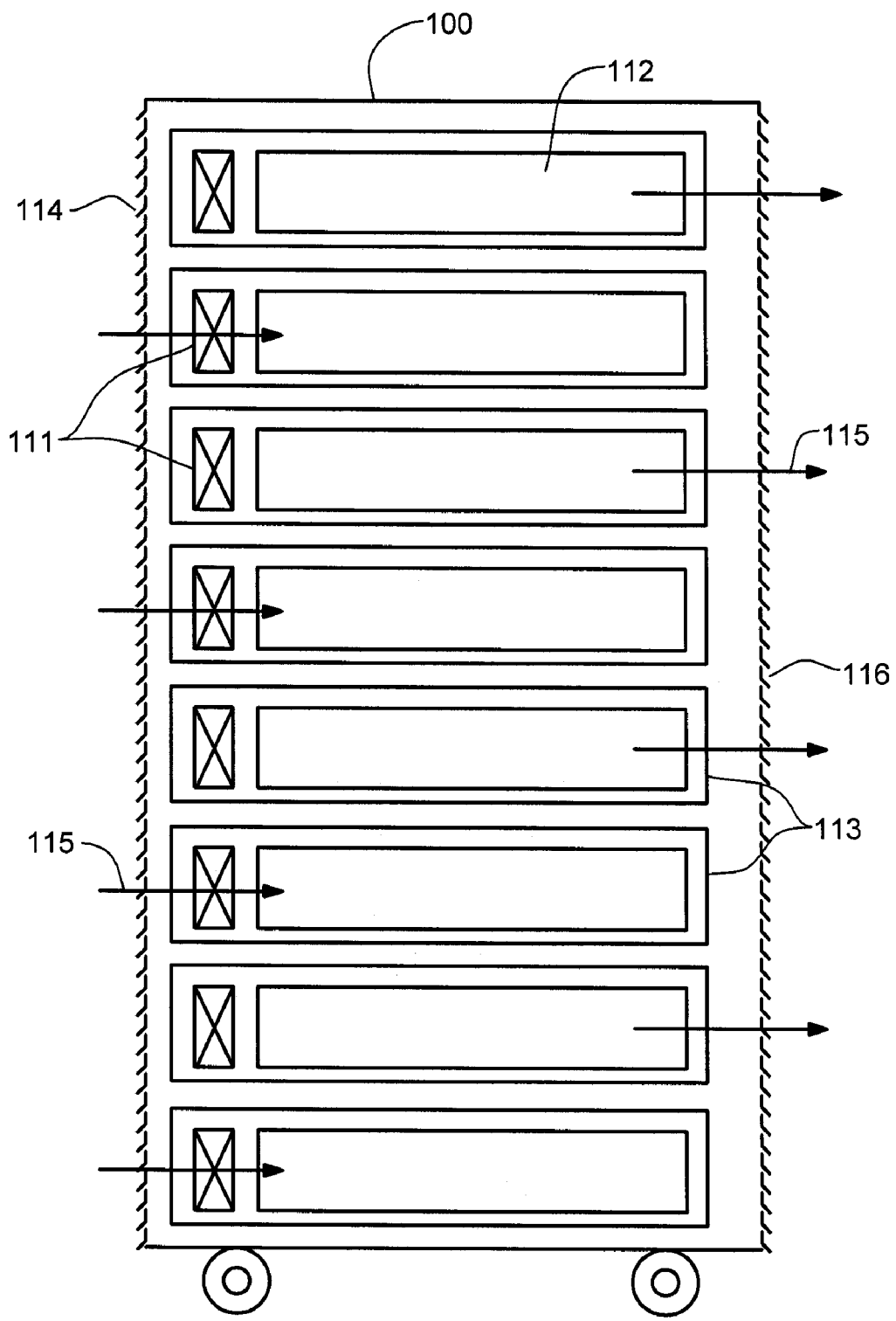
FIG. 1 depicts one embodiment of a conventional air-cooled electronics frame with heat generating electronic components disposed in removable electronics drawers.

As shown in FIG. 1, in rack-mounted configurations typical in the prior art, a plurality of air moving devices 111 (e.g., fans or blowers) provide forced air flow 115 needed to cool the electronic components 112 within the electronics drawers 113 of the frame 100. Cool air is taken in through a louvered inlet cover 114 in the front of the frame and exhausted out a louvered outlet cover 116 in the back of the frame.

Figure 2:
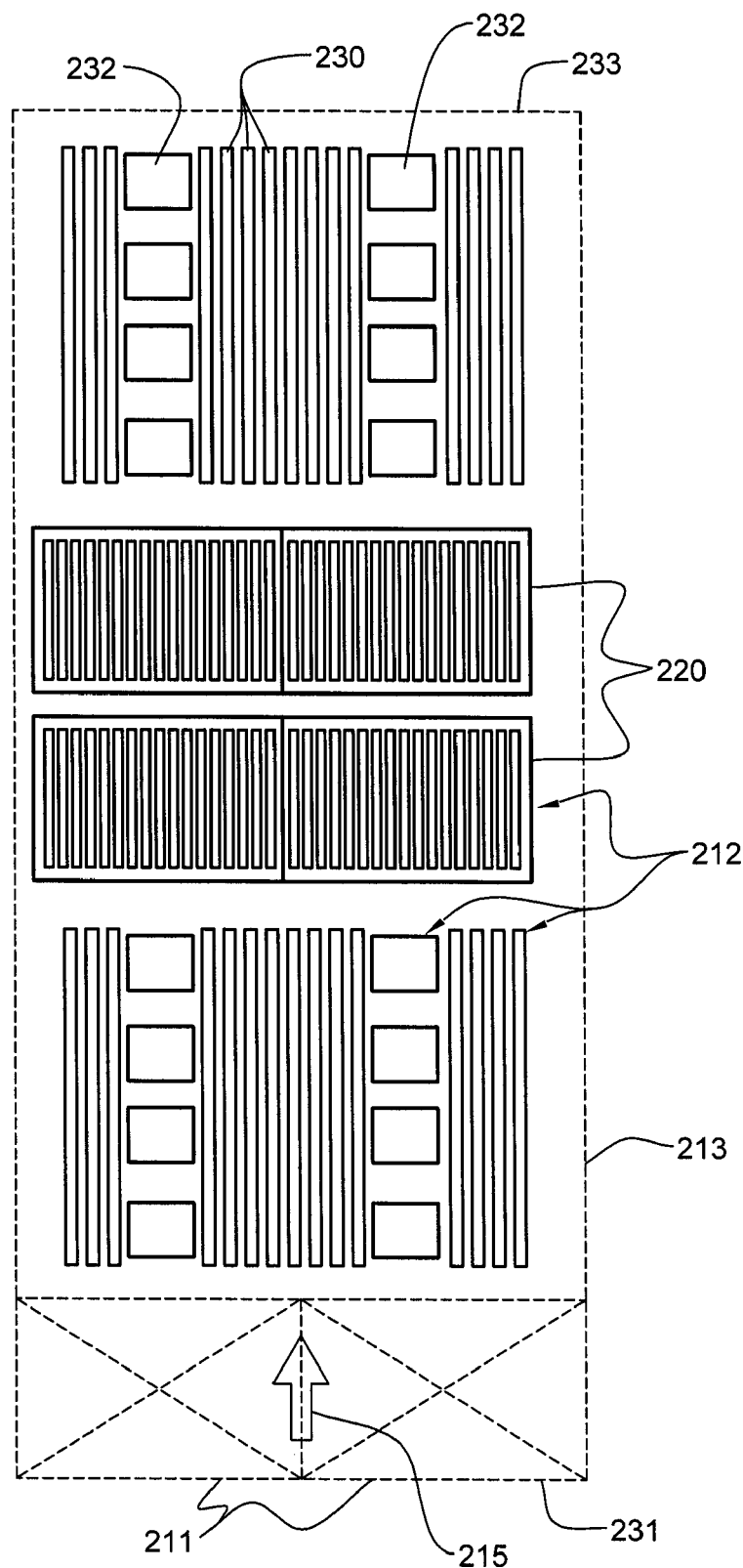
FIG. 2 is a plan view of one embodiment of an electronics drawer layout illustrating multiple electronic components to be cooled, in accordance with an aspect of the present invention.

FIG. 2 illustrates one embodiment of a multi-component electronics drawer 213 having a component layout in accordance with an aspect of the present invention. Electronics drawer 213 includes one or more air moving devices 211 (e.g., fans or blowers) which provide forced air flow 215 across the multiple electronic components 212 within electronics drawer 213. Cool air is taken in through a front 231 of electronics drawer 213 and exhausted out a back 233 of the electronics drawer. In this embodiment, the multiple electronic components to be cooled 212 include processor modules disposed below air-cooled heat sinks 220, as well as (by way of example) arrayed memory modules 230 (such as air-cooled dual in-line memory module (DIMM) packages) and multiple rows of memory support modules 232 disposed between the arrayed memory modules.

Figure 3:
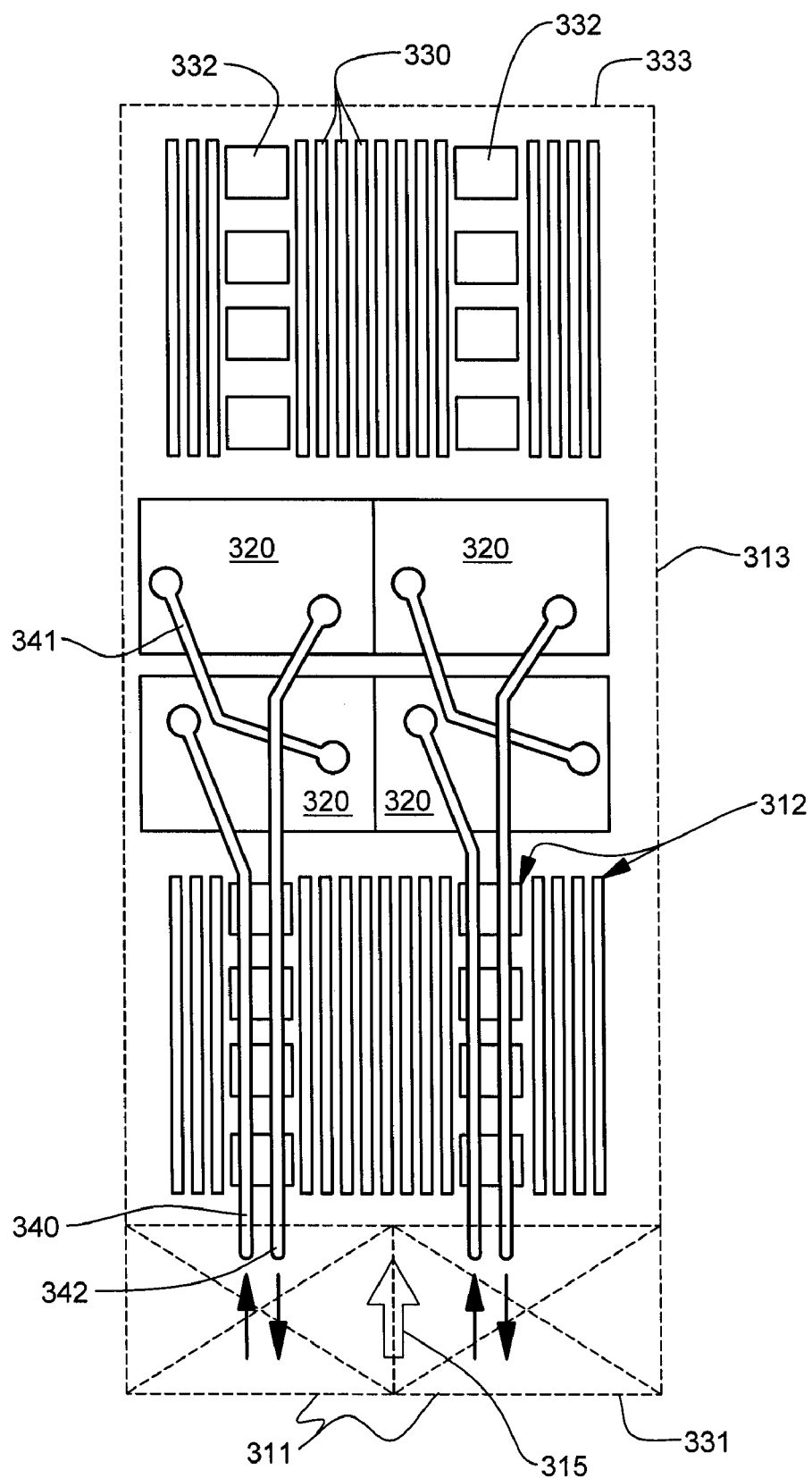
FIG. 3 is a plan view of the electronics drawer layout of FIG. 2 illustrating one embodiment of a cooling system for cooling the components of the drawer, in accordance with an aspect of the present invention.

As noted above, in order to provide greater performance, it will eventually be necessary to increase processor chip powers beyond the point where forced air-cooling is feasible as a solution. Because of their level of power dissipation, the memory support modules and/or memory modules themselves may also require the application of auxiliary cooling to be effectively cooled. To meet these increased cooling demands, a cooling system may be provided with a liquid-based cooling subassembly including at least one liquid-cooled cold plate physically coupled to the at least one primary heat generating component (e.g., processor module) to be cooled. FIG. 3 is a simplified depiction of the electronics drawer component layout of FIG. 2, shown with such a cooling system.

More particularly, FIG. 3 depicts one embodiment of an electronics drawer 313 component layout wherein one or more air moving devices 311 provide forced air flow 315 to cool multiple components 312 within electronics drawer 313. Cool air is taken in through a front 331 and exhausted out a back 333 of the drawer. The multiple components to be cooled include multiple processor modules to which liquid-cooled cold plates 320 are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronics drawer 313, and partially arrayed near back 333 of electronics drawer 313.

Also, in the embodiment of FIG. 3, memory modules 330 and the memory support modules 332 are cooled by air flow 315 across the electronics drawer.

In the embodiment of FIG. 3, the cooling system further includes multiple coolant-carrying tubes connected to and in fluid communication with liquid-cooled cold plates 320. The coolant-carrying tubes comprise sets of coolant-carrying tubes, with each set including a thermally conductive (for example) coolant supply tube 340 and a thermally conductive (for example) coolant return tube 342. In this example, each set of tubes provides liquid coolant to a pair of cold plates 320 (coupled to a pair of processor modules). Coolant flows into a first cold plate of the pair via the coolant supply tube 340 and from the first cold plate to the second cold plate via a bridge tube or line 341, which may or may not be thermally conductive. From the second cold plate of the pair, coolant is returned through the respective coolant return tube 342.

FIG. 4 depicts in greater detail an alternate electronics drawer layout comprising eight processor modules, each having a respective liquid-cooled cold plate of a cooling system coupled thereto. The cooling system further includes associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem may be chilled water.

As noted, various liquid coolants significantly outperform air in the task of removing heat from heat generating components of an electronics system, and thereby more effectively maintain the components at a desireable temperature for reliability and peak performance. As liquid-based cooling systems are designed and deployed, it is advantageous to architect systems which maximize reliability and minimize the potential for leaks while meeting all other mechanical, electrical and chemical requirements of a given electronics system implementation. These more robust cooling systems have unique problems in their assembly and implementation. For example, one assembly solution is to utilize multiple fittings within the electronics system, and use flexible plastic or rubber tubing to connect headers, cold plates, pumps and other components. However, such a solution may not meet a given customer's specifications and need for reliability.

Thus, presented herein is a liquid-based cooling system assembly approach which results in a robust and reliable liquid-based cooling system. As used herein, "assembly" refers to placement and connection of cooling system components, as well as installation of the liquid-based cooling system in operable engagement with the electronics system, and more particularly, with selected primary heat generating components thereof to be cooled.

As an overview, FIG. 4 depicts a partially assembled electronics system 413 and an assembled liquid-based cooling system 415 coupled to the primary heat generating components (e.g., processor modules) to be cooled. In this embodiment, the electronics system includes, by way of example, a support substrate or motherboard 405, a plurality of memory module sockets 410, with the memory modules (e.g., dual in-line memory modules) not shown, multiple rows of memory support modules 432 (each having coupled thereto an air-cooled heat sink 434), and multiple processor modules (not shown) disposed below the liquid-cooled cold plates 420 of the liquid-based cooling system 415. In addition to liquid-cooled cold plates 420, liquid-based cooling system 415 includes multiple coolant-carrying tubes, including coolant supply tubes 440 and coolant return tubes 442 in fluid communication with respective liquid-cooled cold plates 420.

The coolant-carrying tubes 440, 442 are also connected to a header (or manifold) subassembly 450 which facilitates distribution of liquid coolant to the coolant supply tubes 440 and return of liquid coolant from the coolant return tubes 442. In this embodiment, the air-cooled heat sinks 434 coupled to memory support modules 432 closer to front 431 of electronics drawer 413 are shorter in height than the air-cooled heat sinks 434' coupled to memory support modules 432 near back 433 of electronics drawer 413. This size difference is to accommodate the coolant-carrying tubes 440, 442 since, in this embodiment, the header subassembly is at the front 431 of the electronics drawer and the multiple liquid-cooled cold plates 420 are in the middle of the drawer.

Figure 5A:
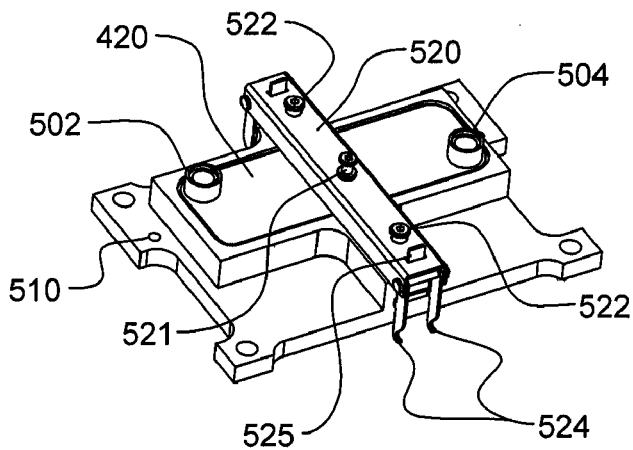
FIG. 5A depicts one embodiment of a liquid-cooled cold plate employed in the cooling system embodiment of FIG. 4, in accordance with an aspect of the present invention.

Referring more particularly to FIGS. 4 & 5A, liquid-based cooling system 415 includes multiple (pre-assembled) liquid-cooled cold plates 420. Each liquid-cooled cold plate 420 includes, in this embodiment, a liquid coolant inlet 502 (see FIG. 5A) and a liquid coolant outlet 504, as well as an attachment subassembly 520. The attachment subassembly 520 is employed to couple the liquid-cooled cold plate 420 to the associated processor module to form the cold plate and processor module assemblies depicted in FIG. 4. Alignment openings 510 are provided on either side of the cold plate for use in the assembly process, as described further below. Additionally, connectors 522 are included within attachment subassembly 520 which facilitate operation of the attachment assembly, as explained in detail in the above-incorporated application entitled "Liquid-Based Cooling System for Cooling a Multi-Component Electronics System". Further, attachment components 524 of attachment subassembly 520 are shown in FIG. 5A to extend below a lower surface of the liquid-cooled cold plate. Attachment subassembly 520 is shown to further include load actuation adjusters (e.g., load actuation screws) 521 for facilitating application of loading pressure against the cold plate and memory module assembly, and load arm engagement tabs 525 for facilitating engagement of the cold plate to the memory module.

Figure 5B:
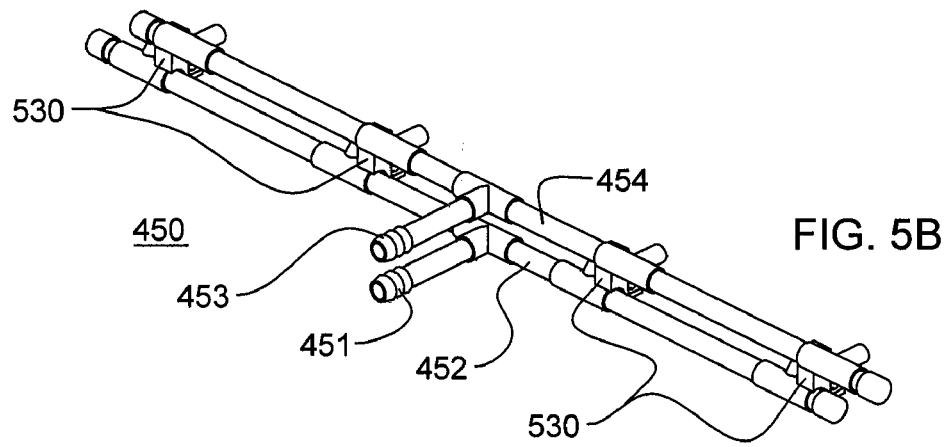
FIG. 5B depicts one embodiment of a header subassembly employed in the cooling system embodiment of FIG. 4, in accordance with an aspect of the present invention.

As shown in FIGS. 4 & 5B, header subassembly 450 includes two liquid manifolds, i.e., a coolant supply header 452 and a coolant return header 454, which in one embodiment, are coupled together via supporting brackets 530. The coolant supply header 452 couples to each coolant supply tube 440, while the coolant return header 454 couples to each coolant return tube 442. A single coolant inlet 451 and a single coolant outlet 453 extend from the header subassembly for coupling to the electronics rack's coolant supply and return manifolds 480, 481, respectively.

Figure 5C:
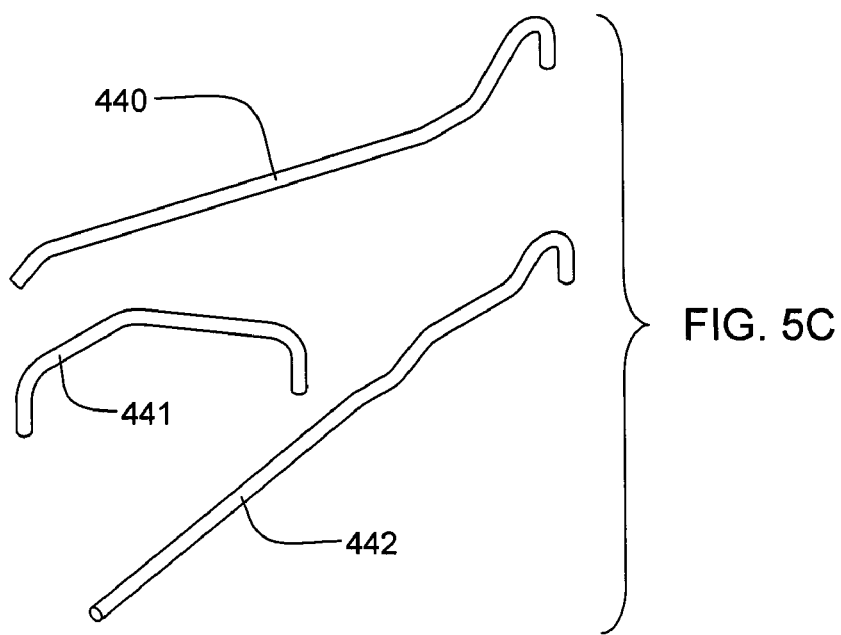
FIG. 5C depicts multiple preconfigured coolant-carrying tubes employed in the cooling system embodiment of FIG. 4, in accordance with an aspect of the present invention.

FIGS. 4 & 5C depict one embodiment of the coolant-carrying tubes. In addition to coolant supply tubes 440 and coolant return tubes 442, bridge tubes or lines 441 are provided for coupling, for example, a liquid coolant outlet of one liquid-cooled cold plate to the liquid coolant inlet of another liquid-cooled cold plate in order to connect in series fluid flow two cold plates, with the two cold plates receiving liquid coolant from a respective set of coolant-carrying tubes. In this embodiment, the coolant supply tubes 440, bridge tubes 441 and coolant return tubes 442 are each preformed, substantially rigid tubes formed of a weldable, brazable or solderable material, such as copper or aluminum. The tubes are preformed to facilitate assembly of the liquid-based cooling system into a particular electronics system.

Figure 6:
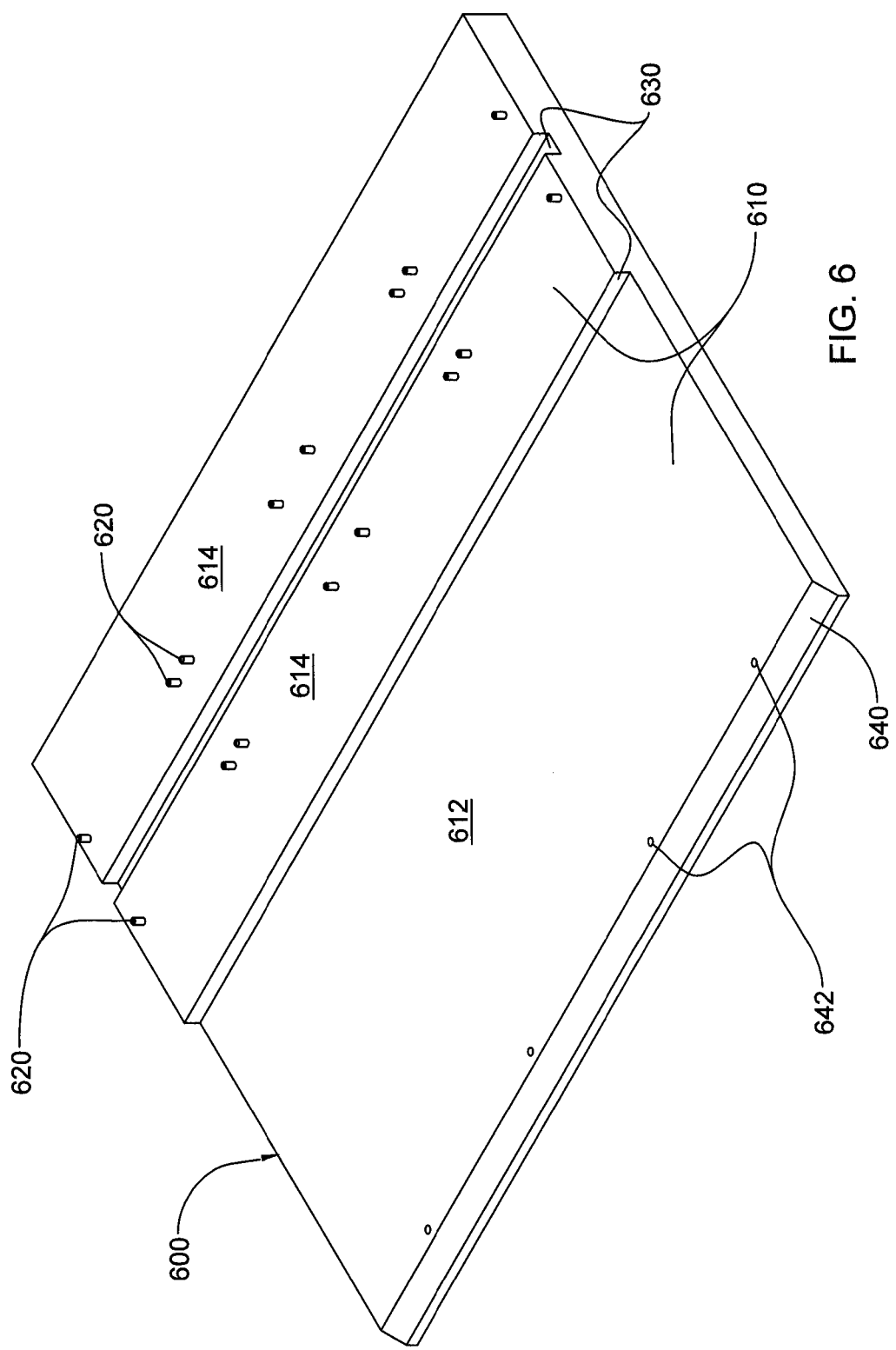
FIG. 6 depicts one embodiment of a support fixture employed in a cooling system assembly method, in accordance with an aspect of the present invention.

FIG. 6 depicts one embodiment of a support fixture 600, in accordance with an aspect of the present invention. Support fixture 600 is specifically configured for facilitating assembly of a liquid-based cooling system for an electronics system such as depicted in FIG. 4. Support fixture 600 includes a multi-level support surface 610 and multiple positioning dowels or pins 620 extending from a portion thereof. Multi-level assembly surface 610 includes a first surface portion 612 disposed at a first level and multiple second surface portions 614 disposed at a second level above the first level. Both the first surface portion 612 and second surface portions 614 are planar surfaces. The second level is a raised level corresponding in relative height to an upper surface height of the multiple heat generating components (e.g., processor modules) above the support substrate (e.g., motherboard or planar) of the electronics system. More particularly, in this example, second surface portions 614 are at a height which mirrors the height of the heat generating components to be cooled.

Reliefs 630 are provided in the support fixture to accommodate attachment components 524 (FIG. 5A) of the attachment subassemblies of the individual liquid-cooled cold plates which, as noted, extend below the lower surface of the liquid-cooled cold plates. Multiple positioning dowels 620 are configured and located to function as alignment pins for receiving the multiple liquid-cooled cold plates, with each positioning dowel 620 extending into a respective alignment opening 510 (FIG. 5A) of a respective liquid-based cold plate when the liquid-based cooling system if fully assembled and supported by the support fixture 600.

Advantageously, positioning dowels 620 are configured and located to match multiple dowels or pins which extend from the support substrate or planar of the electronics system and are employed in positioning the primary heat generating components thereon. As explained further below, the multiple dowels extending from the support substrate of the electronics system also facilitate placement of the multiple liquid-cooled cold plates of the assembled liquid-based cooling system in engagement with the respective heat generating components of the electronics system using the transfer fixture of FIG. 8.

As also shown, support fixture 600 of FIG. 6 further includes a relief 640 for the header subassembly, as well as openings 642, which are mounting locations for the header subassembly brackets.

Note again that the support fixture depicted in FIG. 6 is provided by way of example only and is configured specifically for assembling or transporting the liquid-based cooling system depicted in FIG. 4. Specifically, support surfaces are provided analogous to the module lid or chip backsides (depending on the attachment process used in the processor product) and positioning dowels are provided at the nominal locations of the positioning dowels on the planar support substrate of the electronics system to which the liquid-cooled cold plates are eventually fixed. Various reliefs are provided to prevent interference between (for example) the dangling attachment components and the support fixture, and mounting locations are provided for other cooling system components, such as the header subassembly.

Figure 7:
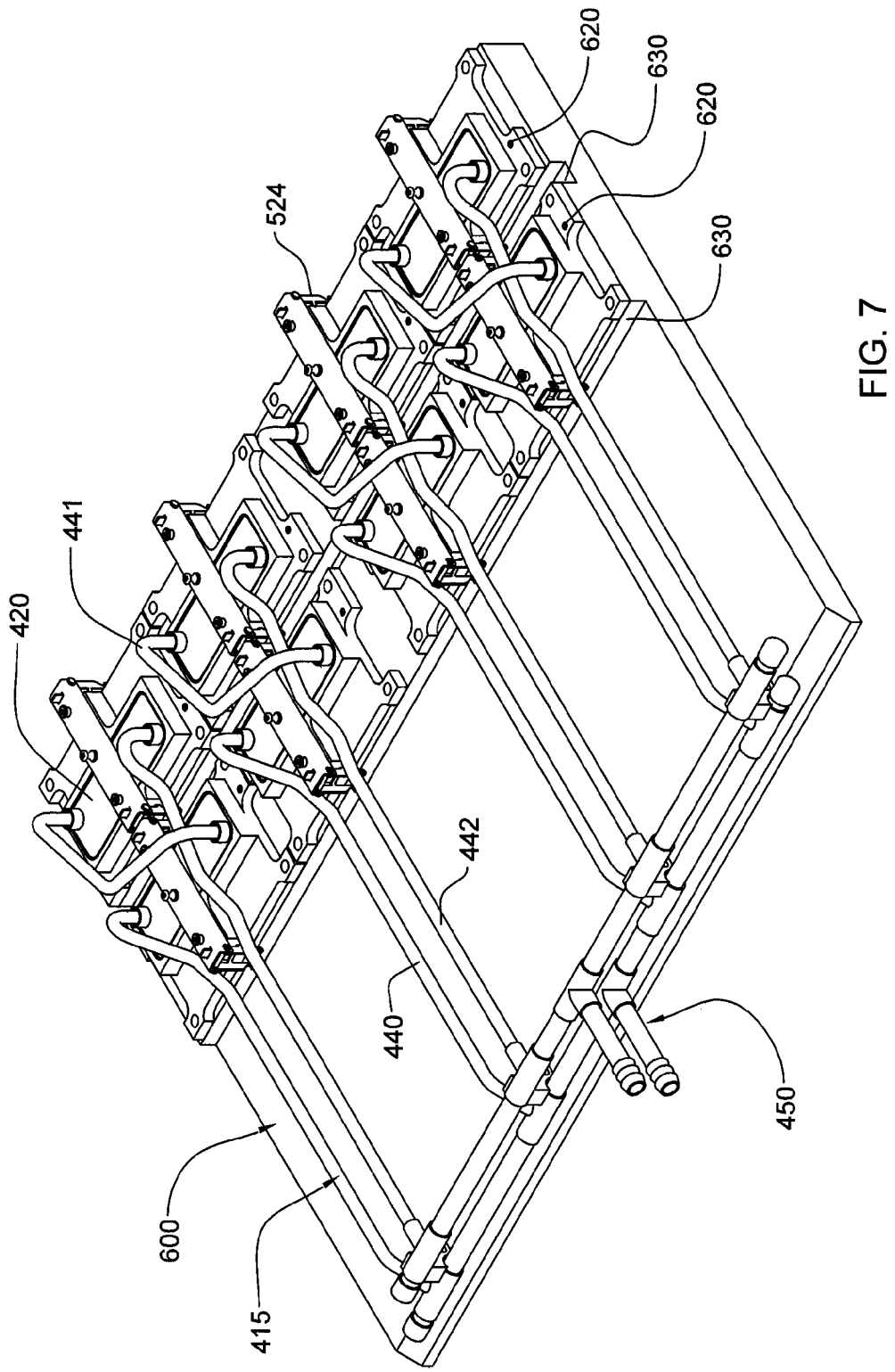
FIG. 7 depicts the support fixture of FIG. 6 shown with an assembled liquid-based cooling system residing thereon, in accordance with an aspect of the present invention.

FIG. 7 illustrates support fixture 600 supporting an assembled liquid-based cooling system 415. Assembly of the cooling system is accomplished by: positioning the multiple liquid-cooled cold plates on the second, raised surfaces employing the multiple positioning dowels 620 extending therefrom. As noted, the positioning dowels provide relative positioning and alignment of the multiple liquid-cooled cold plates for facilitating subsequent coupling thereof to the multiple heat generating components to be cooled. The coolant-carrying tubes 440, 441, 442 are connected to the multiple liquid-cooled cold plates by metallurgical bonding, e.g., by welding, brazing or soldering the tubes to the cold plates 420. Similarly, header subassembly 450 is connected to the coolant-carrying tubes 440, 442 by welding, brazing or soldering, thereby forming sealed fluid paths sufficiently robust to withstand operation, testing and shipping without developing leaks or changing performance characteristics (i.e., device temperature or pressure drop in operation). Advantageously, support fixture 600 is fabricated to withstand the temperatures required in welding, brazing or soldering the components of the liquid-based cooling system together. For example, if brazing is to be employed, the support fixture is fabricated to withstand the temperatures of a braze oven. After welding, brazing or soldering, the cooling system components are in fixed relation in their appropriate nominal locations for later assembly onto the electronics system.

In one implementation, the cooling system is assembled employing the support fixture at one facility and shipped or transported to a different facility still attached to the support fixture. Thus, the support fixture serves the further function of preventing shipping damage due to shock, vibration or other source of damage that could mar critical contacting surfaces of the cold plates or change the relative positions of the cooling system components. Once assembled onto the support fixture, the cooling system components are maintained in fixed relation by the support fixture. Finally, depending attachment components 524 of the attachment subassembly of the individual liquid-cooled cold plates 420 are shown to depend below the second, raised support surfaces within reliefs 630 of the support fixture.

Figure 8:
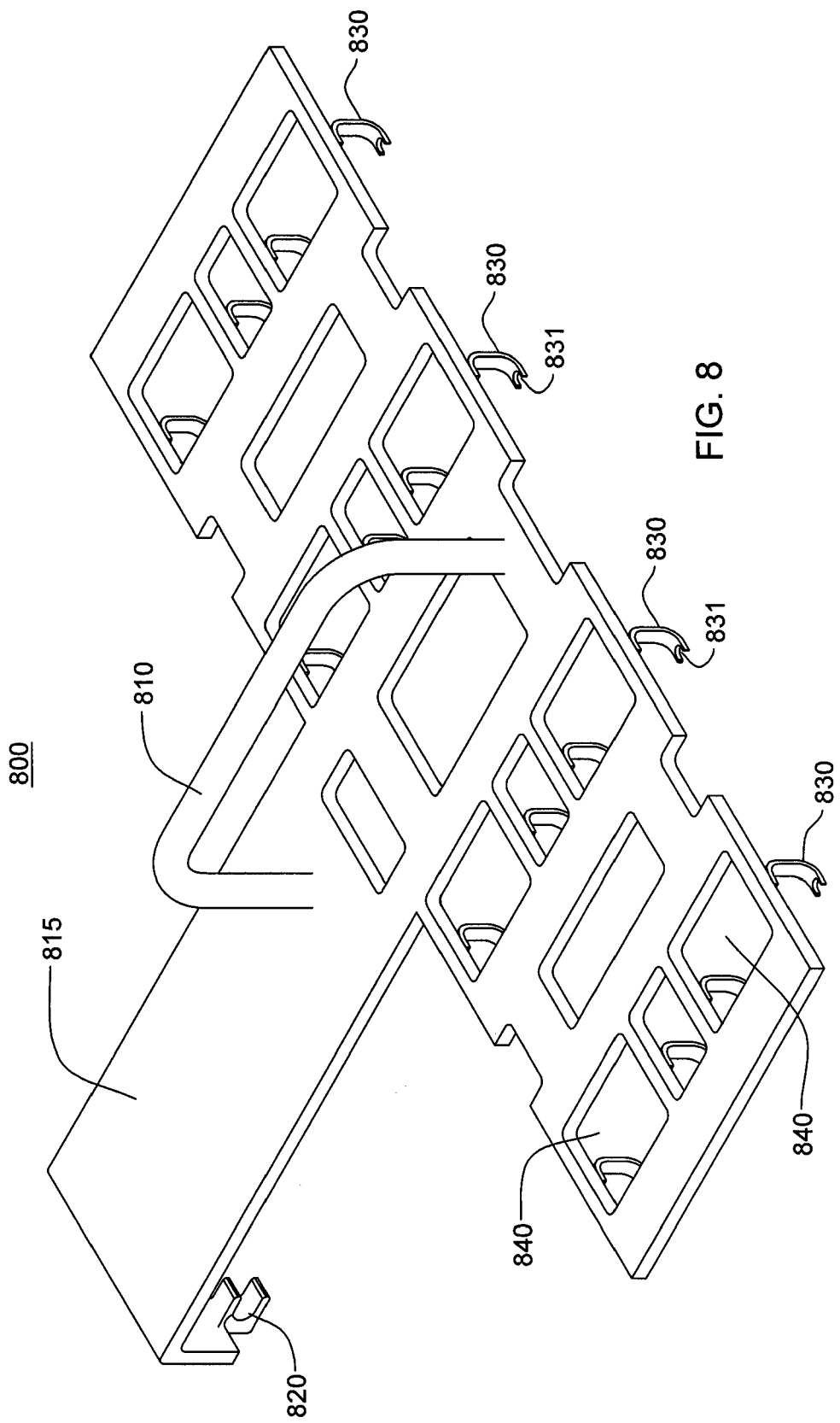
FIG. 8 depicts one embodiment of a transfer fixture to be employed in removing the assembled liquid-based cooling system from the support fixture, and in placing the assembled liquid-based cooling system in engagement with the electronics system to be cooled, in accordance with an aspect of the present invention.

FIG. 8 depicts one embodiment of a transfer fixture, generally denoted 800, employed in removing the assembled liquid-based cooling system from the support fixture and placing the assembled liquid-based cooling system in engagement with the electronics system. Transfer fixture 800 includes a handle 810 coupled to a rigid, T-shaped support structure 815. Support structure 815 includes one or more clips 820 positioned for engaging the header subassembly of the cooling system and a plurality of clips 830 positioned for engaging respective fasteners 522 (FIG. 5A) of the attachment subassembly coupled to the individual liquid-cooled cold plates. Clips 820 are appropriately configured (for example, in a C-shape) to receive a feature of the header subassembly, such as the coolant return header of the header subassembly. Each clip 830 includes a slot 831 sized and configured to engage a respective fastener of the attachment subassembly of the individual liquid-cooled cold plates. Openings 840 are provided within rigid, T-shaped support structure 815 to facilitate use of the transfer fixture in engaging the assembled liquid-based cooling system and in placing the assembled liquid-based cooling system in engagement with the electronics system to be cooled.

Those skilled in the art should note that the embodiment of FIG. 8 is provided by way of example only. The transfer fixture is configured for a particular cooling system embodiment and is employed to maintain components of an assembled liquid-based cooling system in fixed relation when removing the cooling system from the support fixture and placing the cooling system in engagement with the multiple heat generating components of the electronics system to be cooled. In the embodiment presented, coupling mechanisms (e.g., clips) are provided to secure the header subassembly and the multiple liquid-cooled cold plates, while still allowing access to the necessary fasteners and clips required to affix the cooling system to the electronics system. In one embodiment, the handle is provided near the full assembly's center of gravity to allow an operator to easily lift and manipulate the transfer fixture and the assembled liquid-based cooling system.

Figure 9:
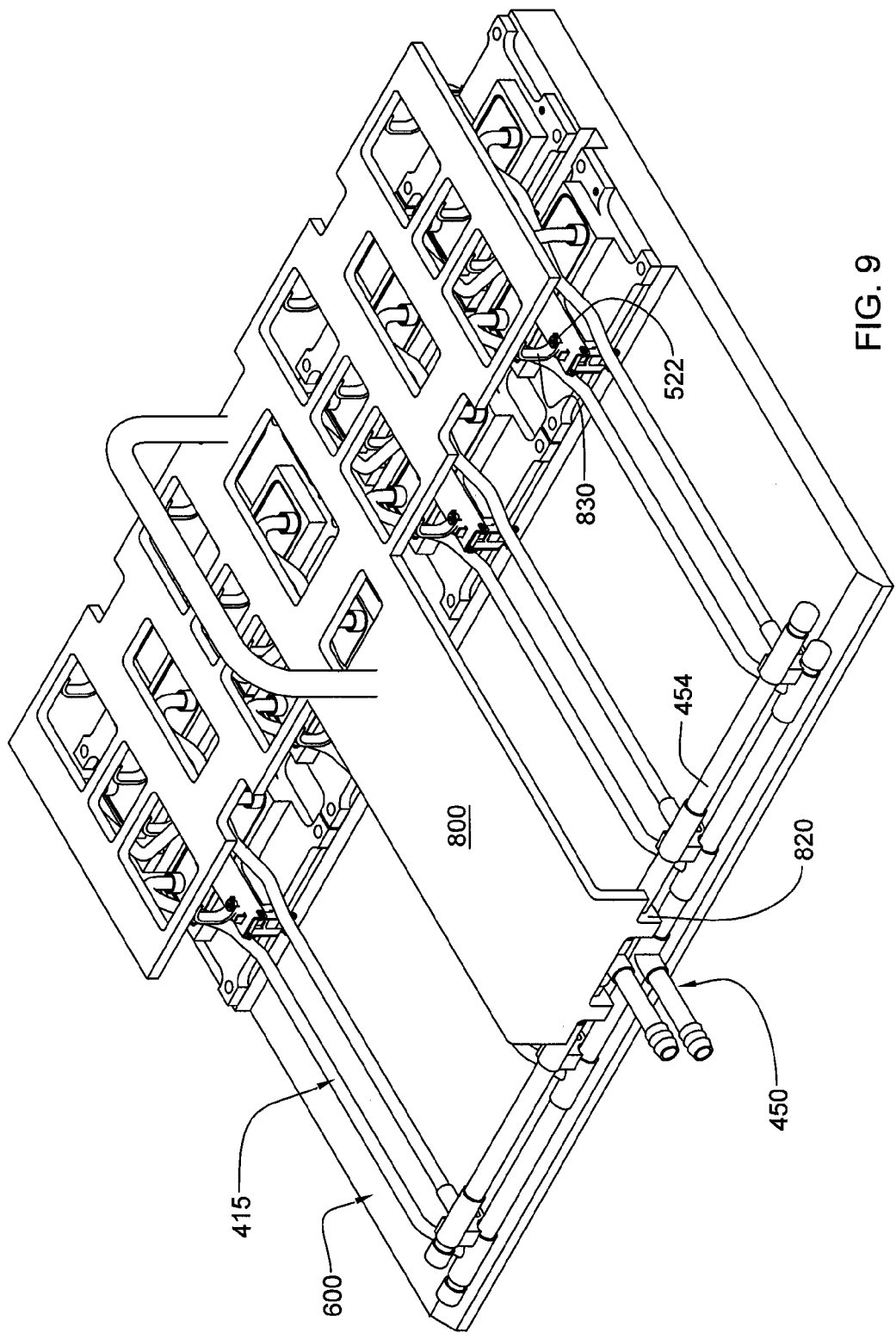
FIG. 9 depicts the transfer fixture of FIG. 8 shown in engaging position atop the assembled liquid-based cooling system and support fixture of FIG. 7, in accordance with an aspect of the present invention.

FIG. 9 depicts the assembled liquid-based cooling system 415 and support fixture 600 of FIG. 7 shown with transfer fixture 800 of FIG. 8 positioned in engagement with the cooling system. To obtain this assembly, the header subassembly clips 820 first engage the header subassembly 450 (and more particularly, engage coolant return header 454), and the transfer fixture is then pivoted downward towards the multiple liquid-cooled cold plates and shifted to the left (in this example). Once the capture slots 831 (FIG. 8) of clips 830 are aligned with respective fasteners 522 of the attachment subassemblies, transfer fixture 800 is shifted to the right, engaging the fasteners into the appropriate slots and enabling removal of the assembled liquid-based cooling system from the support fixture. Note also that fasteners (not shown) may be employed on the support fixture to ensure co-planarity of the conducting surfaces of the liquid-cooled cold plates. These fasteners might be disposed in the corner holes of the multiple liquid-cooled cold plates, which are designed to be accessible through openings 840 in transfer fixture 800.

Figure 10:
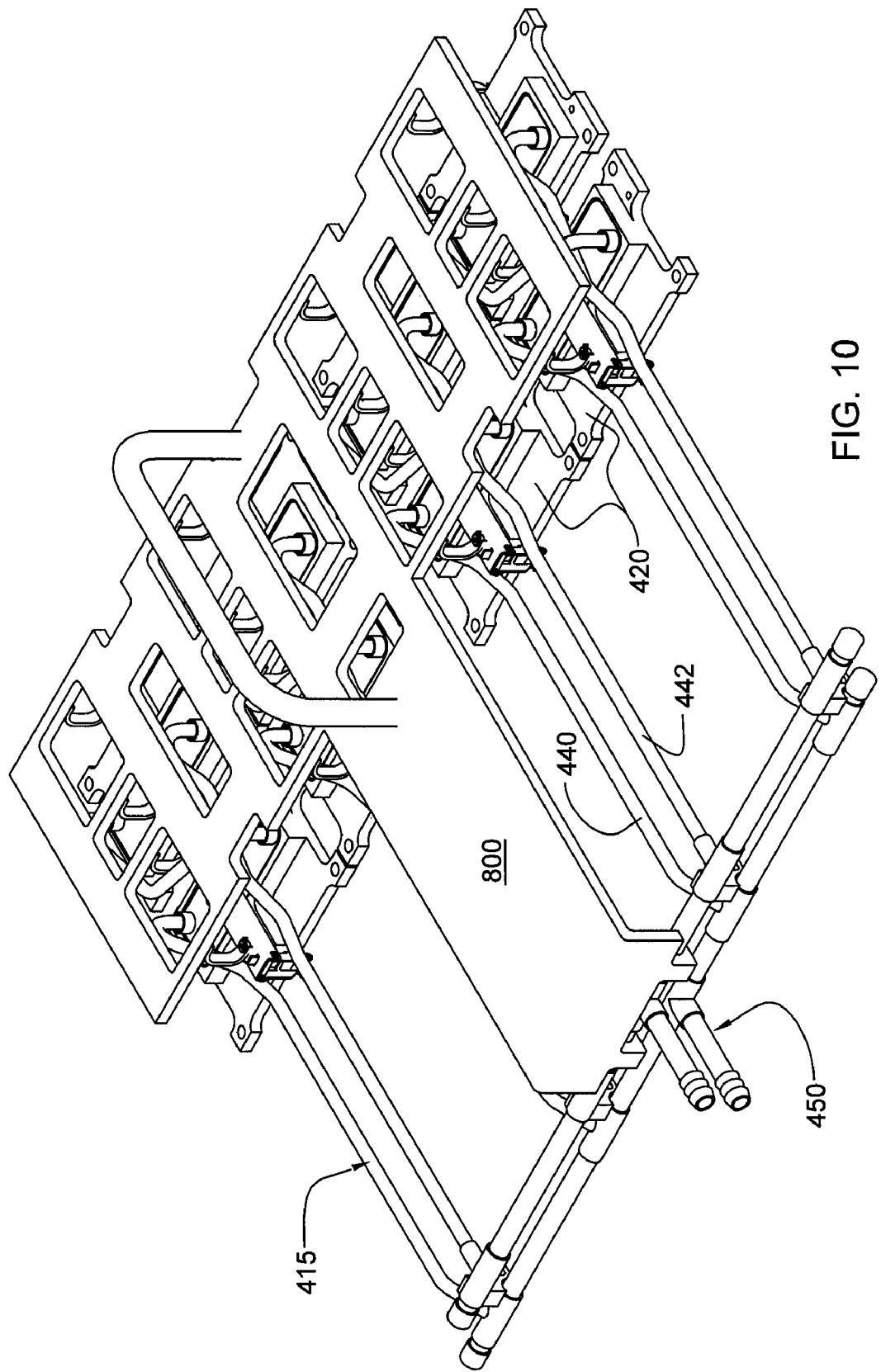
FIG. 10 illustrates the assembled liquid-based cooling system and transfer fixture after removal of the assembled liquid-based cooling system from the support fixture, in accordance with an aspect of the present invention.

FIG. 10 depicts the assembled liquid-based cooling system 415 and transfer fixture 800 removed from the support fixture. As shown, the multiple liquid-cooled cold plates 420, coolant-carrying tubes 440, 442 and header subassembly 450 are maintained in fixed relation by the transfer fixture. In this step, an operator could also clean critical surfaces (e.g., of the liquid-cooled cold plates), apply a thermal interface material to the critical contacting surfaces of the cold plates, and then install the cooling system onto the electronics system.

Figure 11:
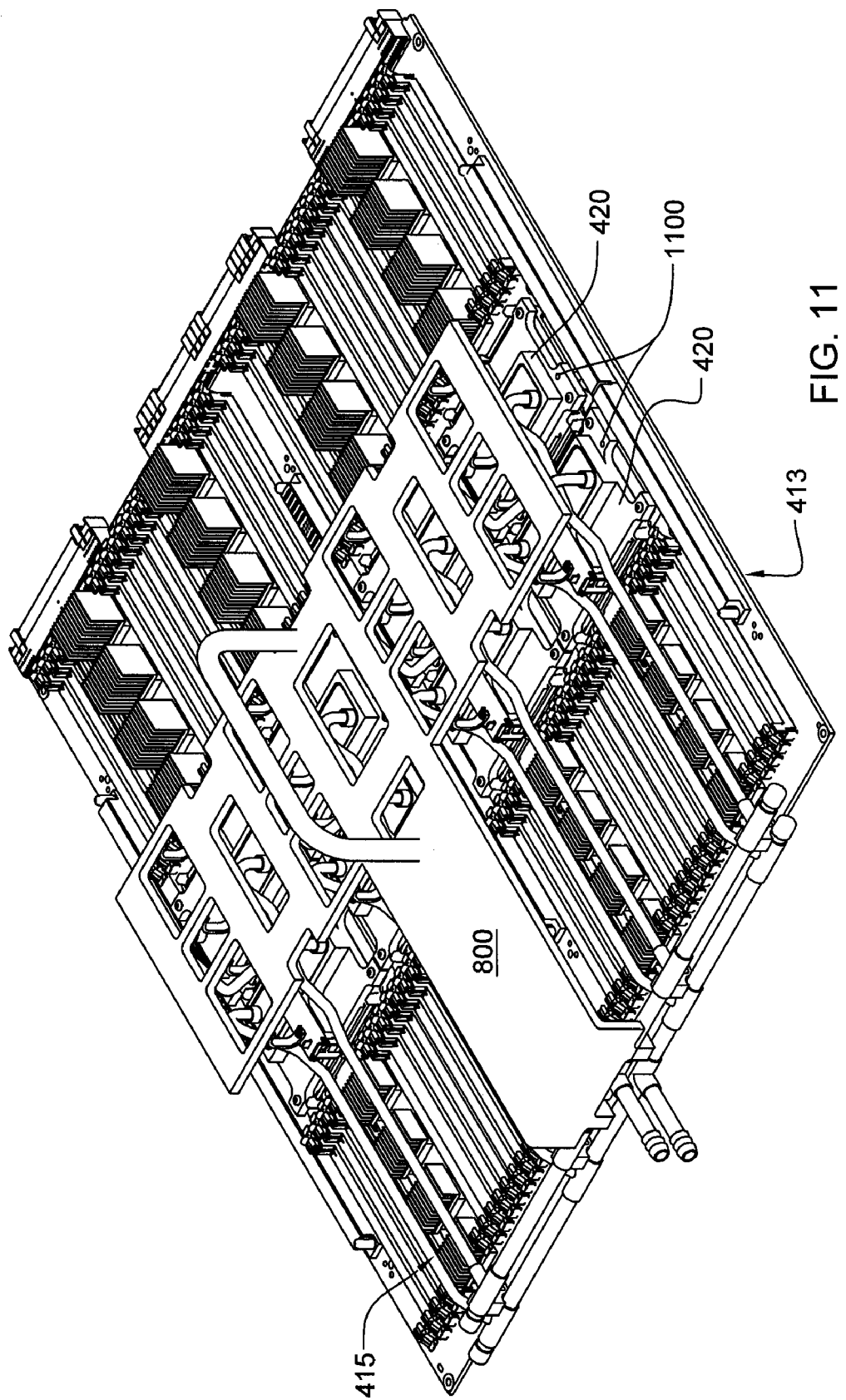
FIG. 11 depicts employing the transfer fixture in placing the assembled liquid-based cooling system in proper engagement with the electronics system, in accordance with an aspect of the present invention.

FIG. 11 depicts the assembled liquid-based cooling system 415, still affixed to transfer fixture 800, in its final operative position on electronics system 413 with the multiple liquid-cooled cold plates 420 coupled to their respective heat generating components (e.g., processor modules) to be cooled. As noted above, multiple dowels or pins 1100 extend from the support substrate or planar of electronics system 413. These dowels facilitate proper positioning of the heat generating components to be cooled, and are also advantageously employed in placing the multiple liquid-cooled cold plates of the assembled liquid-based cooling system in engagement with the respective heat generating components of the electronics system to be cooled via alignment of appropriate cold plate openings with the dowels.

Figure 11A:
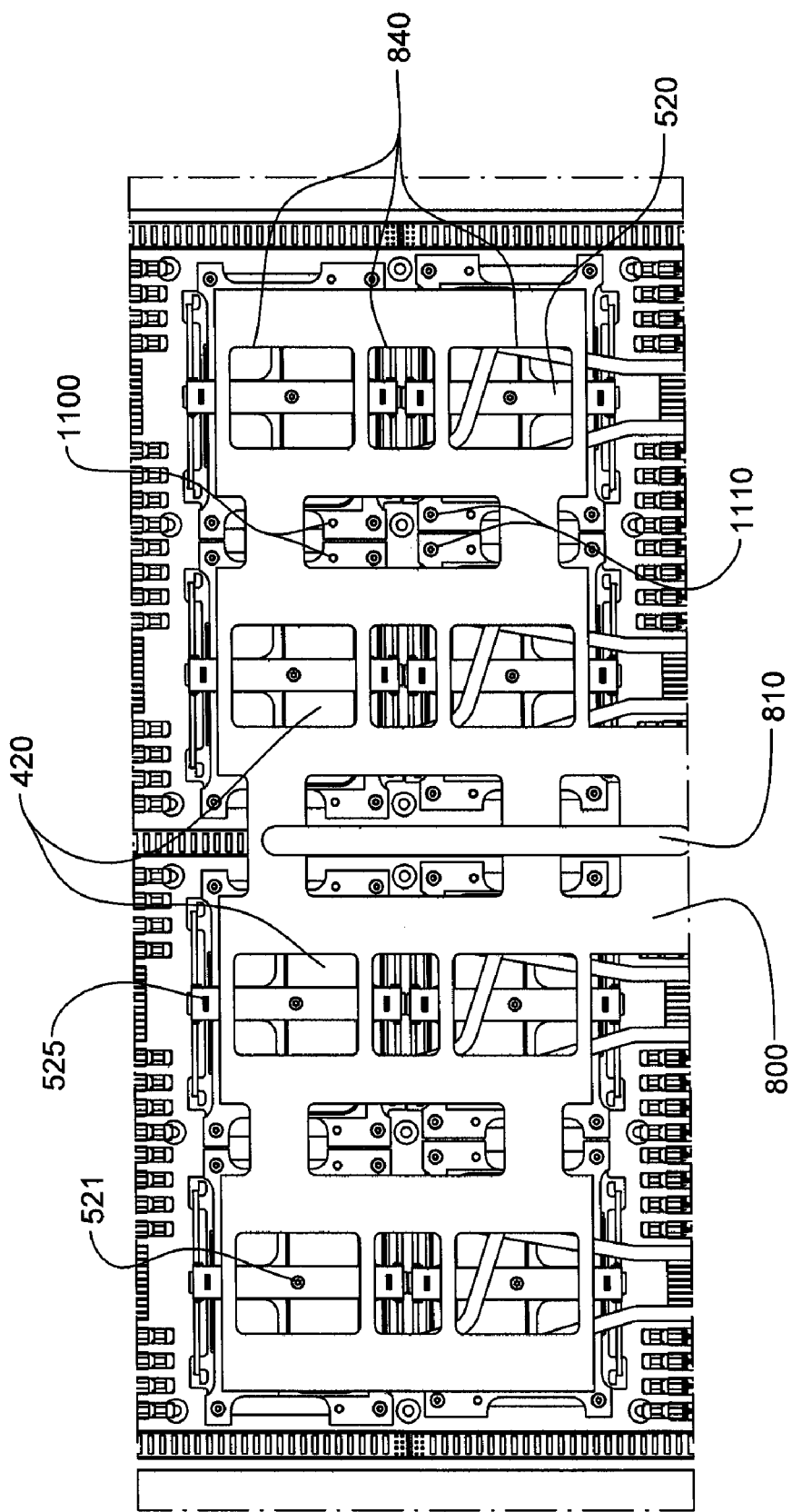
FIG. 11A is a partial plan view of the assembly of FIG. 11 showing that the openings in the transfer fixture are disposed for accessing key fasteners during installation of the assembled liquid-based cooling system onto the electronics system to be cooled, in accordance with an aspect of the present invention.

FIG. 11A is a partial top plan view of the assembly of FIG. 11 showing transfer fixture 800, handle 810 and openings 840 in the transfer fixture for viewing the multiple liquid cooled cold plates 420, attachment subassemblies 520, positioning dowels 1100 and attachment mechanisms 1110 securing the cold plates to the processor modules to be cooled. This figure illustrates that openings 840 are strategically placed to facilitate proper engagement of the cooling system with the electronic system. More particularly, openings 840 are positioned to allow access to load actuation adjusters 521 and load arm engagement tabs 525 of the attachment subassemblies 520, as well as viewing of positioning dowels 1100 and accessing of attachment mechanisms 1110.

To summarize, presented herein (in one aspect) is a method of assembling a cooling system for an electronics system. The method includes: providing a support fixture for facilitating assembly of a liquid-based cooling system to be transferred to an electronics system having multiple heat generating components to be cooled, the support fixture including a multi-level support surface and multiple positioning dowels extending from a portion thereof; positioning multiple liquid-cooled cold plates on the support surface of the support fixture employing the multiple positioning dowels extending therefrom, the multiple positioning dowels providing relative positioning and alignment of the multiple liquid-cooled cold plates for facilitating subsequent coupling thereof to the multiple heat generating components to be cooled; sealing multiple coolant-carrying tubes in fluid communication with the multiple liquid-cooled cold plates, the multiple coolant-carrying tubes facilitating passage of liquid coolant through the multiple liquid-cooled cold plates when the liquid-based cooling system is operational; and sealing a header subassembly to the multiple coolant-carrying tubes to provide an assembled liquid-based cooling system on the support fixture, the header subassembly comprising a coolant supply header secured in fluid communication with coolant supply tubes of the multiple coolant-carrying tubes and a coolant return header secured in fluid communication with coolant return tubes of the multiple coolant-carrying tubes.

In enhanced aspects, the multiple coolant-carrying tubes include multiple rigid tubes preconfigured to facilitate subsequent engagement of the assembled liquid-based cooling system with the electronics system, and sealing the multiple coolant-carrying tubes to the multiple liquid-cooled cold plates comprises one of welding, brazing or soldering the multiple coolant-carrying tubes to the multiple liquid-cooled cold plates, and sealing the header subassembly to the multiple coolant-carrying tubes includes one of welding, brazing or soldering the header subassembly to the multiple coolant-carrying tubes.

Further, the support fixture may be employed during transport of the assembled liquid-based cooling system to facilitate maintenance of the multiple liquid-cooled cold plates, multiple coolant-carrying tubes and header subassembly in fixed relation.

In one embodiment, the multi-level support surface of the support fixture includes a first surface portion disposed at a first level and at least one second surface portion disposed at a second level, the multiple positioning dowels extend from the at least one second surface portion disposed at the second level, and the second level is above the first level, and is a raised level corresponding in relative height to an upper surface height of the multiple heat generating components to be cooled above a support substrate of the electronics system. Further, each liquid-cooled cold plate of the multiple liquid-cooled cold plates includes an attachment subassembly including attachment components which depend below a lower surface of the liquid-cooled cold plate. The second level of the at least one second surface portion of the support fixture is configured and raised sufficiently above the first level to accommodate the attachment components of the attachment subassemblies depending below the lower surfaces of the multiple liquid-cooled cold plates. In one embodiment, reliefs are provided in the support fixture to accommodate the depending attachment components of the attachment subassemblies. Further, the first surface portion and the second surface portions are each planar surfaces, and the first surface portion includes openings corresponding to mounting locations for brackets of the header subassembly, and a relief for accommodating one of the coolant supply header and coolant return header of the header subassembly.

In another aspect, a method of assembling a cooling system is provided. This method includes: obtaining an assembled liquid-based cooling system comprising multiple liquid-cooled cold plates connected to multiple coolant-carrying tubes in fluid communication with the multiple liquid-cooled cold plates, and including a header subassembly secured to the multiple coolant-carrying tubes, the header subassembly including a coolant supply header secured in fluid communication with coolant supply tubes of the multiple coolant-carrying tubes and a coolant return header secured in fluid communication with coolant return tubes of the multiple coolant-carrying tubes, the assembled liquid-based cooling system residing on and being supported in fixed relation by a support fixture, and being configured to cool multiple heat generating components of an electronics system when operationally coupled thereto; employing a transfer fixture for engaging and removing the assembled liquid-based cooling system from the support fixture, the transfer fixture including a rigid support structure comprising multiple clips for engaging the multiple liquid-cooled cold plates and the header subassembly, and for holding the multiple liquid-cooled cold plates, the multiple coolant-carrying tubes, and the header subassembly in fixed relation when removed from the support fixture; and employing the transfer fixture to place the assembled liquid-based cooling system in engagement with the electronics system, wherein the electronics system includes multiple dowels for positioning the multiple heat generating components to be cooled, the multiple dowels also facilitating placement of the multiple liquid-cooled cold plates of the assembled liquid-based cooling system in proper engagement with respective heat generating components of the electronics system being cooled employing the transfer fixture.

Although preferred embodiments have been depicted and described in detail herein, it will be apparent to those skilled in the relevant art that various modifications, additions, substitutions and the like can be made without departing from the spirit of the invention, and that these are therefore considered to be within the scope of the invention as defined in the following claims.

What is claimed is:

1. A method of pre-assembling a cooling system for an electronics system, the method comprising:

providing a support fixture for facilitating assembly of a liquid-based cooling system to be transferred to an electronics system having multiple heat generating components to be cooled, the support fixture including a multi-level support surface and multiple positioning dowels extending from a portion thereof;

positioning multiple liquid-cooled cold plates on the support surface of the support fixture employing the multiple positioning dowels extending therefrom, the multiple positioning dowels providing and preserving relative positioning and alignment of the multiple liquid-cooled cold plates for facilitating subsequent coupling thereof to the multiple heat generating components to be cooled, the relative positioning and alignment of the multiple liquid-cooled cold plates mirroring the relative positioning and alignment of the multiple heat-generating components of the electronics system to be cooled;

sealing multiple coolant-carrying tubes in fluid communication with the multiple liquid-cooled cold plates, the multiple coolant-carrying tubes facilitating passage of liquid coolant through the multiple liquid-cooled cold plates when the liquid-based cooling system is operational; and sealing a header subassembly to the multiple coolant-carrying tubes to provide an assembled liquid-based cooling system on the support fixture, the header subassembly comprising a coolant supply manifold secured in fluid communication with coolant supply tubes of the multiple coolant-carrying tubes and a coolant return manifold secured in fluid communication with coolant return tubes of the multiple coolant-carrying tubes.

2. The method of claim 1, wherein the multiple coolant-carrying tubes comprise multiple rigid tubes preconfigured to facilitating subsequent engagement of the pre-assembled liquid-based cooling system with the electronics system, and wherein sealing the multiple coolant-carrying tubes to the multiple liquid-cooled cold plates comprises one of welding, brazing or soldering the multiple coolant-carrying tubes to the multiple liquid-cooled cold plates, and wherein sealing the header subassembly to the multiple coolant-carrying tubes comprises one of welding, brazing or soldering the header subassembly to the multiple coolant-carrying tubes to produce a pre-assembled, monolithic cooling system.

3. The method of claim 1, further comprising employing the support fixture during transport of the pre-assembled liquid-based cooling system from one location to a different location to facilitate maintenance of the multiple liquid-cooled cold plates, multiple coolant-carrying tubes and header subassembly in fixed relation.

4. The method of claim 1, wherein the multi-level support surface of the support fixture comprises a first surface portion disposed at a first level and at least one second surface portion disposed at a second level, and wherein the multiple positioning dowels extend from the at least one second surface portion disposed at the second level, the second level being above the first level, and being a raised level corresponding in relative height to an upper surface height of the multiple heat generating components to be cooled above a support substrate of the electronics system.

5. The method of claim 4, wherein each liquid-cooled cold plate of the multiple liquid-cooled cold plates includes an attachment subassembly including attachment components which depend below a lower surface of the liquid-cooled cold plate, and wherein the second level of the at least one second surface portion of the support fixture is configured and raised sufficiently above the first level to accommodate the attachment components of the attachment subassemblies depending below the lower surfaces of the multiple liquid-cooled cold plates.

6. The method of claim 5, wherein the multiple liquid-cooled cold plates of the pre-assembled liquid-based cooling system are disposed in at least two rows on the support fixture, and wherein the support fixture includes a relief in the at least one second surface portion disposed between the at least two rows, the relief in the at least one second surface portion being configured to accommodate the attachment components of the attachment subassemblies of the multiple liquid-cooled cold plates disposed in the at least two rows of the assembled liquid-based cooling system on the support fixture.

7. The method of claim 4, wherein the first surface portion and the second surface portion each comprise planar surfaces, and wherein the first surface portion includes openings sized and positioned to correspond to mounting locations for brackets of the header subassembly, and a relief configured to accommodate one of the coolant supply manifold or the coolant return manifold of the header subassembly.

8. A method of assembling a cooling system for an electronics system, the method comprising:
obtaining a pre-assembled liquid-based cooling system comprising multiple liquid-cooled cold plates connected to multiple coolant-carrying tubes in fluid communication with the multiple liquid-cooled cold plates, and including a header subassembly secured to the multiple coolant-carrying tubes, the header subassembly comprising a coolant supply manifold secured in fluid communication with coolant supply tubes of the multiple coolant-carrying tubes and a coolant return manifold secured in fluid communication with coolant return tubes of the multiple coolant-carrying tubes, the assembled liquid-based cooling system residing on and being supported by a support fixture with the multiple liquid-cooled cold plates thereof in fixed relation, and being configured to cool multiple heat generating components of an electronics system when operationally coupled thereto, wherein the support fixture preserves the multiple liquid-cooled cold plates in a relative fixed positioning and alignment which corresponds to a relative positioning and alignment of the multiple heat-generating components of the electronics system to be cooled;
employing a transfer fixture for engaging and removing the pre-assembled liquid-based cooling system from the support fixture, the transfer fixture including a rigid support structure comprising multiple clips for engaging the multiple liquid-cooled cold plates and the header subassembly and for holding the multiple liquid-cooled cold plates, the multiple coolant-carrying tubes, and the header subassembly in fixed relation when removed from the support fixture and transferred to a different location, wherein the transfer fixture preserves the multiple liquid-cooled cold plates in a relative fixed position and alignment which corresponds to the relative positioning and alignment of the multiple heat-generating components of the electronic system to be cooled; and
employing the transfer fixture to place the pre-assembled liquid-based cooling system in engagement with the electronics system, wherein the electronics system includes multiple dowels for positioning the multiple heat generating components to be cooled, the multiple dowels also facilitating placement of the multiple liquid-cooled cold plates of the assembled liquid-based cooling system in proper engagement with respective heat generating components of the electronics system to be cooled employing the transfer fixture.

9. The method of claim 8, wherein for each liquid-cooled cold plate, at least one clip of the multiple clips of the transfer fixture is configured to engage a respective fastener associated with an attachment subassembly of the liquid-cooled cold plate when the transfer fixture is holding the multiple liquid-cooled cold plates, the multiple coolant-carrying tubes, and the header subassembly in fixed relation.

10. The method of claim 8, wherein the rigid support structure of the transfer fixture includes openings sized and positioned to facilitate employing of the transfer fixture to remove the pre-assembled liquid-based cooling system from the support fixture and employing of the transfer fixture to place the assembled liquid-based cooling system in engagement with the electronics system.

11. The method of claim 8, wherein the respective heat generating components of the electronics system to be cooled comprise multiple processors, and wherein the multiple liquid-cooled cold plates each comprise a surface configured for engagement with a respective processor of the multiple processors when the pre-assembled liquid-based cooling system is placed in engagement with the electronics system, and wherein the multiple coolant-carrying tubes comprise multiple preconfigured, thermally conductive rigid tubes in fluid communication with the multiple liquid-cooled cold plates and the header subassembly, and wherein the electronics system is disposed within an electronics drawer of an electronics frame, and the method further comprises coupling the coolant supply header to a coolant supply manifold of the electronics frame and coupling the coolant return header to a coolant return manifold of the electronics frame.

12. The method of claim 11, wherein the multiple preconfigured, thermally conductive rigid tubes are one of welded, brazed or soldered to the multiple liquid-cooled cold plates, and wherein the multiple preconfigured, thermally conductive rigid tubes are one of welded, brazed or soldered to the header subassembly to produce a pre-assembled, monolithic cooling system prior to employing of the transfer fixture to remove the pre-assembled cooling system from the support fixture for placing thereof in engagement with the electronics system.

13. The method of claim 8, wherein obtaining the pre-assembled liquid-based cooling system further comprises pre-assembling the liquid-based cooling system, the assembling comprising:
providing a support fixture for facilitating assembly of the liquid-based cooling system to be transferred to the electronics system having the multiple heat generating components to be cooled, the support fixture including a multi-level assembly surface and multiple positioning dowels extending from a portion thereof;
positioning the multiple liquid-cooled cold plates on the assembly surface of the support fixture employing the multiple positioning dowels extending therefrom, the multiple positioning dowels providing and preserving relative positioning and alignment of the multiple liquid-cooled cold plates for facilitating subsequent coupling thereof to the multiple heat generating components to be cooled, the relative positioning and alignment of the multiple liquid-cooled cold plates mirroring the relative positioning and alignment of the multiple heat-generating components of the electronics system to be cooled;
sealing the multiple coolant-carrying tubes in fluid communication with the multiple liquid-cooled cold plates, the multiple coolant-carrying tubes facilitating passage of liquid coolant through the multiple liquid-cooled cold plates when the liquid-based cooling system is operational; and
sealing the header subassembly to the multiple coolant-carrying tubes to provide the assembled liquid-based cooling system.

14. The method of claim 13, wherein the multiple coolant-carrying tubes comprise multiple rigid tubes preconfigured to facilitate engagement of the assembled liquid-based cooling system with the electronics system, and wherein sealing the multiple coolant-carrying tubes to the multiple liquid-cooled cold plates comprises one of welding, brazing or soldering the multiple coolant-carrying tubes to the multiple liquid-cooled cold plates, and wherein sealing the header subassembly to the multiple coolant-carrying tubes comprises one of welding, brazing or soldering the header subassembly to the multiple coolant-carrying tubes.

15. The method of claim 14, further comprising employing the support fixture during transport of the assembled liquid-based cooling system to facilitate maintenance of the multiple liquid-cooled cold plates, multiple coolant-carrying tubes and header subassembly in fixed relation.

16. The method of claim 13, wherein the multi-level support surface of the support fixture comprises a first surface portion disposed at a first level and at least one second surface portion disposed at a second level, and wherein the multiple positioning dowels extend from the at least one second surface portion disposed at the second level, the second level being above the first level, and being a raised level corresponding in relative height to an upper surface height of the multiple heat generating components to be cooled above a support substrate of the electronics system.

17. The method of claim 16, wherein each liquid-cooled cold plate of the multiple liquid-cooled cold plates includes an attachment subassembly including attachment components which depend below a lower surface of the liquid-cooled cold plate, and wherein the second level of the at least one second surface portion of the support fixture is configured and raised sufficiently above the first level to accommodate the attachment components of the attachment subassemblies depending below the lower surfaces of the multiple liquid-cooled cold plates.

18. The method of claim 17, wherein the multiple liquid-cooled cold plates of the pre-assembled liquid-based cooling system are disposed in at least two rows on the support fixture, and wherein the support fixture includes a relief in the at least one second surface portion disposed between the at least two rows, the relief and the at least one second surface portion being configured to accommodate the attachment components of the attachment subassemblies of the multiple liquid-cooled cold plates disposed in the at least two rows of the assembled liquid-based cooling system on the support fixture.

19. The method of claim 16, wherein the first surface portion and the at least one second surface portion each comprise planar surfaces, and wherein the first surface portion includes openings sized and positioned to correspond to mounting locations for brackets of the header subassembly, and a relief configured to accommodate one of the coolant supply manifold and coolant return manifold of the header subassembly.

20. The method of claim 8, wherein obtaining the pre-assembled liquid-based cooling system includes receiving the assembled liquid-based cooling system on a support fixture, the support fixture facilitating shipping of the assembled liquid-based cooling system by maintaining the multiple liquid-cooled cold plates, multiple coolant-carrying tubes and header subassembly in fixed relation, and wherein the support fixture includes a multi-level support surface and multiple positioning dowels extending from a portion thereof, the multiple positioning dowels providing relative positioning and alignment of the multiple liquid-cooled cold plates on the support fixture, wherein the relative positioning and alignment of the multiple liquid-cooled cold plates on the support fixture facilitates employing of the transfer fixture in placing the assembled liquid-based cooling system in engagement with the electronics system, with each liquid-cold plate in engagement with a respective heat generating component to be cooled.

* * * * *